United States Patent
Lee et al.

(10) Patent No.: US 8,872,146 B2
(45) Date of Patent: Oct. 28, 2014

(54) PHASE-CHANGE RANDOM ACCESS MEMORY DEVICE AND METHOD OF MANUFACTURING THE SAME

(75) Inventors: Seung-Yun Lee, Daejeon (KR); Young Sam Park, Daejeon (KR); Sung Min Yoon, Daejeon (KR); Kyu-Jeong Choi, Daejeon (KR); Nam-Yeal Lee, Daejeon (KR); Byoung-Gon Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 407 days.

(21) Appl. No.: 12/821,414

(22) Filed: Jun. 23, 2010

(65) Prior Publication Data
US 2010/0258780 A1    Oct. 14, 2010

Related U.S. Application Data

(62) Division of application No. 11/951,148, filed on Dec. 5, 2007, now Pat. No. 7,767,994.

(30) Foreign Application Priority Data

Dec. 5, 2006 (KR) .......... 10-2006-0122618
May 4, 2007 (KR) .......... 10-2007-0043800

(51) Int. Cl.
*H01L 45/00*    (2006.01)

(52) U.S. Cl.
USPC ............................. 257/2; 257/E45.002

(58) Field of Classification Search
USPC .......... 257/188, 441, 442, 613–616, E29.296, 257/1–5, 528, 529, E45.001–E45.004; 438/95
See application file for complete search history.

(56) References Cited

U.S. PATENT DOCUMENTS

| | | | |
|---|---|---|---|
| 6,566,700 B2 * | 5/2003 | Xu .............................. | 257/296 |
| 2006/0017076 A1 * | 1/2006 | Lankhorst et al. ............ | 257/246 |
| 2008/0055969 A1 * | 3/2008 | Liu .............................. | 365/163 |
| 2008/0303014 A1 * | 12/2008 | Goux et al. .................. | 257/3 |

* cited by examiner

*Primary Examiner* — Marcos D. Pizarro

(57) ABSTRACT

Provided are a Phase-change Random Access Memory (PRAM) device and a method of manufacturing the same. In particular, a PRAM device including a heating layer, wherein the heating layer comprises first and second heating layers having different physical properties from each other and a method of manufacturing the same are provided. Since the PRAM device according to the present invention includes a heating layer having optimal heating characteristics, a PRAM device having high reliability and excellent operating characteristics can be manufactured.

7 Claims, 7 Drawing Sheets

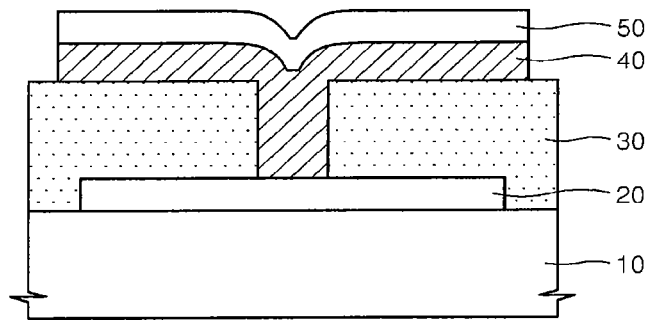
FIG. 1A <PRIOR ART>
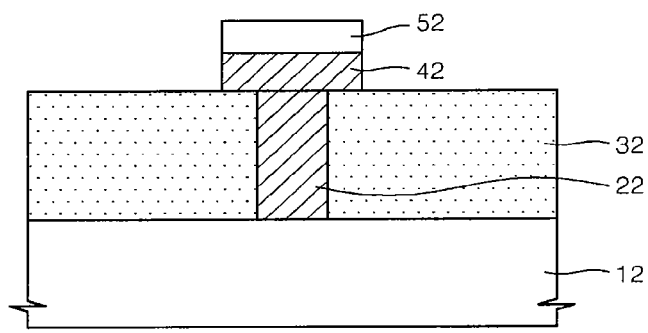
FIG. 1B <PRIOR ART>
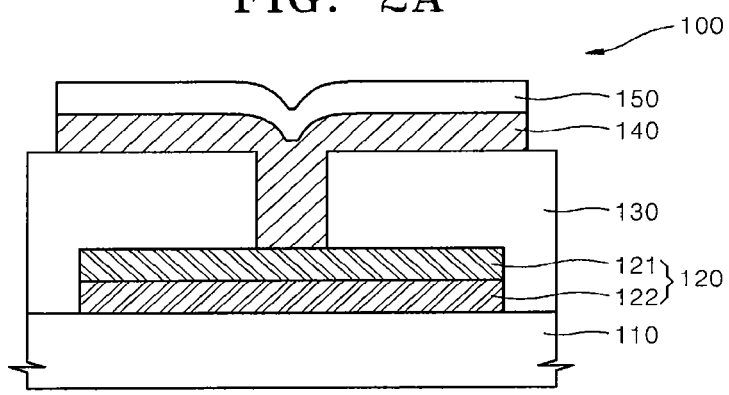
FIG. 2A

PHASE-CHANGE RANDOM ACCESS MEMORY DEVICE AND METHOD OF MANUFACTURING THE SAME

CROSS-REFERENCE TO RELATED PATENT APPLICATION

This application claims the benefit of Korean Patent Application No. 10-2006-0122618, filed on Dec. 5, 2006, and 10-2007-0043800, filed on May 4, 2007 in the Korean Intellectual Property Office, the disclosure of which are incorporated herein in its entirety by reference.

BACKGROUND OF THE INVENTION

1. Field of the Invention

The present invention relates to a Phase-change Random Access Memory (PRAM) device and a method of manufacturing the same, and more particularly, to a PRAM device having high reliability and excellent operating characteristics by including a heating layer having optimal heating characteristics and a method of manufacturing the same. This work was supported by the IT R&D program of MIC/IITA. [2005-S-072-02, Technology of a nano scale phase change data storage]

2. Description of the Related Art

Phase-change Random Access Memory (PRAM) devices are memory devices using a characteristic that electrical resistance of a phase change material formed of a chalcogenide compound including the elements Se, Te, and S is changed according to its crystalline phase. That is, the crystalline phase of the phase change material can be reversibly switched between a crystalline state and an amorphous state according to a voltage or current applied to the phase change material, each state having a different electrical resistance. Such PRAM devices are non-volatile, fast, and can be highly integrated.

Since electrical resistance of a phase change material is significantly changed according to whether the phase change material is in a crystalline or an amorphous state, physical properties of the phase change material can be used to apply the phase change material for use as information storing devices. More specifically, a PRAM memory device is operated according to a set process and a reset process described below. The set process comprises changing a phase change material layer of the PRAM memory device from an amorphous state with high resistance to a crystalline state with low resistance. The reset process comprises changing the phase change material layer of the PRAM memory device from a crystalline state to an amorphous state. For the set and reset processes, two types of current pulses having different amplitudes and times are needed. A reset pulse having a high amplitude and short time increases the internal temperature of a phase change material layer above a melting point so that a crystalline structure of the phase change material layer is maintained in a liquid state, and is cooled down after the pulse is completed, so that the crystalline structure of the phase change material layer is changed into an amorphous state. A set pulse having a relatively lower amplitude and longer time than the reset pulse increases temperature of the phase change material layer above a crystallization temperature so that a crystalline structure of the phase change material layer is changed into a crystalline state.

FIGS. 1A and 1B are side cross-sectional views of a conventional PRAM device. Referring to FIG. 1A, the conventional PRAM device includes a lower electrode 10 and an upper electrode 50 respectively disposed on the lower part and the upper part of a phase change material layer 40 and a heating layer 20 disposed to contact the phase change material layer 40. Also, portions of each of the phase change material layer 40 and the heating layer 20 required to be insulated from each other are insulated by an interlayer insulation film 30. Such structure may selectively have a structure where a heating layer 22 having a small cross section is disposed below a phase change material layer 42, as illustrated in FIG. 1B. Here, a lower electrode 12, an upper electrode 52, and an interlayer insulation film 32 may correspond to the lower electrode 10, the upper electrode 50, and the interlayer insulation film 30 illustrated in FIG. 1A, respectively.

An operation of the conventional PRAM device is described below with reference to FIGS. 1A and 1B.

When a current is applied through the lower electrodes 10 and 12 and the upper electrodes 50 and 52, joule heat is generated from the heating layers 20 and 22 and phases of some regions of the phase change material layers 40 and 42 are changed. Since heat generated from the phase change material layers 40 and 42 may not be sufficient to cause phase change, the heating layers 20 and 22 are employed in this regard. Accordingly, in general, the heating layers 20 and 22 may be formed of materials having high electrical resistance which can generate a sufficient amount of heat.

TiN, TiAlN, and TiSiC are widely used as the materials for the heating layers 20 and 22, and W can also be used as a material for the heating layers 20 and 22. For these materials to be used as the heating layers 20 and 22, they should have high electrical resistivity ($\rho$), low thermal conductivity, and low specific heat. The electrical resistivity should be high to generate a large amount of heat, thermal conductivity should be low to reduce unnecessary heat loss to the outside, and specific heat should be low to cause large temperature changes. The most important parameters of these properties are electrical resistivity and thermal conductivity.

Conventionally, such heating layers 20 and 22 are formed of a single material. However, materials that satisfy the above conditions have not yet been found. Accordingly, heating layers using excellent physical properties of conventionally known materials are required.

SUMMARY OF THE INVENTION

The present invention provides a memory device having high reliability and excellent operating characteristics by including a heating layer having optimal heating characteristics.

The present invention also provides a method of manufacturing a memory device having high reliability and excellent operating characteristics by including a heating layer having optimal heating characteristics.

According to an aspect of the present invention, there is provided a Phase-change Random Access Memory (PRAM) device including: an lower electrode formed on a semiconductor substrate; an upper electrode formed on the lower electrode; a phase change material layer disposed between the lower electrode and the upper electrode, and a heating layer disposed between the upper electrode or the lower electrode and the phase change material layer, wherein the heating layer comprises a first heating layer and a second heating layer, the first heating layer contacting the phase change material layer and the second heating layer contacting the first heating layer and being disposed between the first heating layer and the upper electrode or the lower electrode.

The first heating layer may include a material having lower resistivity than the resistivity of a material forming the second heating layer. More specifically, the first heating layer may include titanium nitride (TiN) and the second heating layer comprises polysilicon (poly Si) or polysilicon germanium (poly-SiGe).

The first heating layer may include a material which blocks diffusion of titanium. More specifically, the first heating layer may include at least one selected from the group consisting of TaN, TiAlN, WN, WBN, TiSiN, TaSiN, WSiN, TiSiC, TaSiC, WSiC, and low resistivity TiN. In particular, the second heating layer may include high resistivity TiN. The low resistivity TiN may have a resistivity of 100 μΩ·cm or less.

The first heating layer may include a material having higher resistivity than the resistivity of a material forming the second heating layer and the second heating layer comprises a material having lower thermal conductivity than the thermal conductivity of a material forming the first heating layer. More specifically, the first heating layer may include TiAlN and the second heating layer comprises TaN, TiN, or polysilicon germanium (poly-SiGe).

According to another aspect of the present invention, there is provided a method of manufacturing a Phase-change Random Access Memory (PRAM) device including: forming a heating material layer comprising a first heating material layer and a second heating material layer on a substrate including a lower electrode; etching the heating material layer to form a heating layer comprising a first heating layer and a second heating layer; forming an insulation layer on the top and side surfaces of the heating layer and on the top surface of the lower electrode; forming a contact hole in the insulation layer so that a portion of the heating layer is exposed; forming a phase-change material layer filling the contact hole; and forming an upper electrode on the phase-change material layer.

According to another aspect of the present invention, there is provided a method of manufacturing a Phase-change Random Access Memory (PRAM) device including: forming an insulation layer on a substrate including a lower electrode; forming a contact hole in the insulation layer so that a portion of the lower electrode is exposed; forming a second heating layer in the contact hole; forming a first heating layer on the second heating layer; and sequentially forming a phase-change material layer and an upper electrode on the first heating layer.

The first heating layer may include a material having lower resistivity than the resistivity of a material forming the second heating layer. The first heating layer may include titanium nitride (TiN) and the second heating layer comprises polysilicon (poly Si) or polysilicon germanium (poly-SiGe).

The first heating layer may include a material which blocks diffusion of titanium. More specifically, the first heating layer may include at least one selected from the group consisting of TaN, TiAlN, WN, WBN, TiSiN, TaSiN, WSiN, TiSiC, TaSiC, WSiC, and low resistivity TiN. The second heating layer may include high resistivity TiN. The low resistivity TiN may have resistivity of 100 μΩ·cm or less.

The first heating layer may include a material having higher resistivity than the resistivity of a material forming the second heating layer and the second heating layer comprises a material having lower thermal conductivity than the thermal conductivity of a material forming the first heating layer. More specifically, the first heating layer may include TiAlN and the second heating layer comprises TaN, TiN, or polysilicon germanium (poly-SiGe).

BRIEF DESCRIPTION OF THE DRAWINGS

The above and other features and advantages of the present invention will become more apparent by describing in detail exemplary embodiments thereof with reference to the attached drawings in which:

FIGS. 1A and 1B are side cross-sectional views of a conventional Phase-change Random Access Memory (PRAM) device;

FIGS. 2A and 2B are side cross-sectional views of PRAM devices according to embodiments of the present invention;

DETAILED DESCRIPTION OF THE INVENTION

Figure 2B:
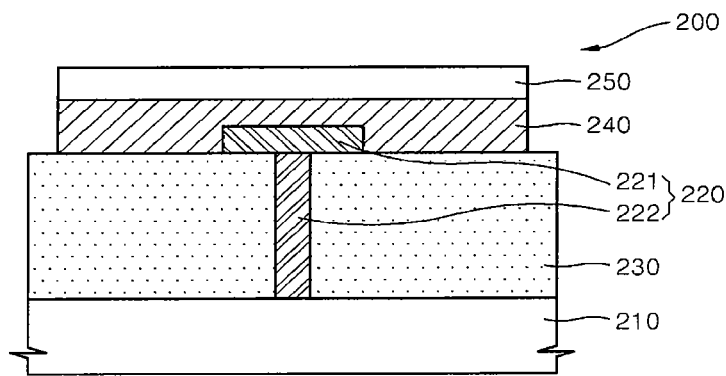

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, like reference numerals denote like elements. Furthermore, various elements and regions are schematically illustrated. Therefore, the present invention is not limited to sizes and distances illustrated in the accompanying drawings.

The present invention provides a Phase-change Random Access Memory (PRAM) device including a lower electrode formed on a semiconductor substrate, an upper electrode formed on the lower electrode, and a phase change material layer disposed between the lower electrode and the upper electrode, and more particularly, to a PRAM device further including a heating layer disposed between the upper electrode or the lower electrode and the phase change material layer, the heating layer including a first heating layer contacting the phase change material layer and a second heating layer contacting the first heating layer and being disposed between the first heating layer and the upper electrode or the lower electrode.

FIGS. 2A and 2B are side cross-sectional views of PRAM devices 100 and 200 according to embodiments of the present invention.

Referring to FIGS. 2A and 2B, the PRAM devices 100 and 200 according to the current embodiments of the present invention include heating layers 120 and 220 including first heating layers 121 and 221 and second heating layers 122 and 222, lower electrodes 110 and 210, upper electrodes 150 and 250, phase change material layers 140 and 240, and interlayer insulation films 130 and 230, respectively, and are different from the conventional PRAM device illustrated in FIG. 1A in that heating layers 120 and 220 illustrated in FIGS. 2A and 2B are formed of dual layers including first heating layers 121 and 221 and second heating layers 122 and 222 having different physical properties from each other, respectively.

It is obvious to one of ordinary skill in the art that the heating layers 120 and 220 are distinguished from the lower electrodes 110 and 210 and are different from a metal wiring.

The lower electrodes 110 and 210, the upper electrodes 150 and 250, the phase change material layers 140 and 240, and the interlayer insulation films 130 and 230 may be formed of conventionally known materials and are not particularly limited.

The first heating layers 121 and 221 and the second heating layers 122 and 222 can be formed of materials described in examples below according to required purposes.

Example 1

Figure 3:
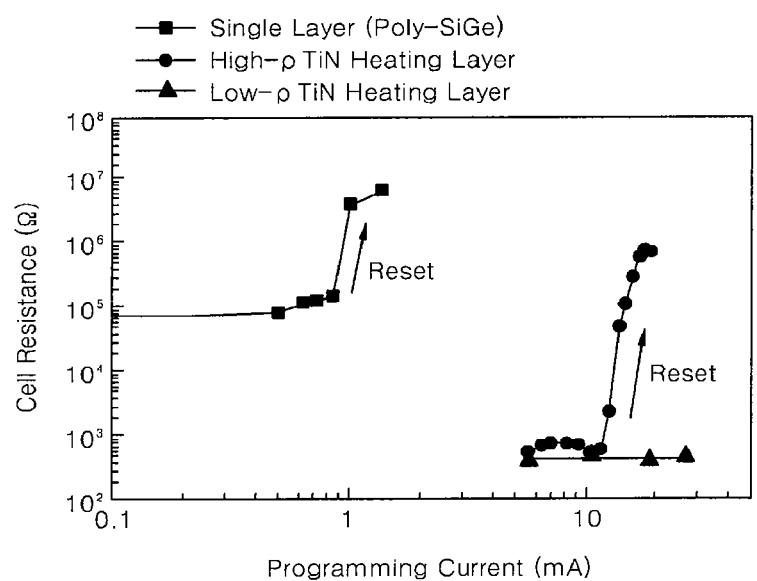
FIG. 3 is a graph showing a small reset current when polysilicon germanium (poly-SiGe) is used as a material for forming a heating layer.

In general, one of the desirable characteristics of the heating layer of a PRAM device is high resistivity. If the resistivity is high, a large amount of joule heat is generated so that a reset current required for a reset operation is decreased and thus the power required to operate the PRAM device is also decreased. For example, polysilicon (poly Si) or polysilicon germanium (poly-SiGe) has resistivity that is no less than twice as high as that of TiN so that reset current can be significantly reduced. FIG. 3 is a graph showing a small reset current when polysilicon germanium (poly-SiGe) is used as a material for forming a heating layer. Referring to FIG. 3, resistivity of poly-SiGe is significantly higher than high resistivity ($\rho$) TiN.

Figure 4:
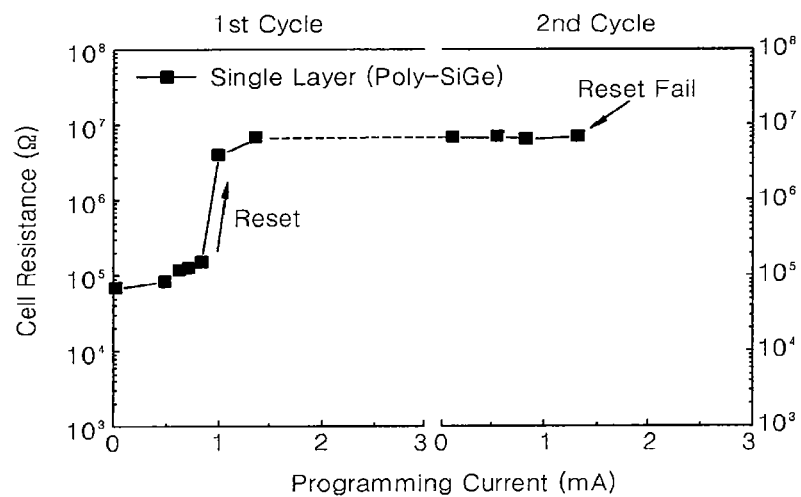
FIG. 4 is a graph showing a reset failure when poly-SiGe is used as a material for forming a heating layer.

However, when poly-SiGe is used alone as the heating layer, excessive joule heat is generated due to high resistivity and thus a reset failure can be generated. FIG. 4 is a graph showing a reset failure when poly-SiGe is used as a material for forming a heating layer. Referring to FIG. 4, when a programming current is applied to the heating layer of a PRAM device in a first cycle, the crystalline structure of a phase change material layer of the PRAM device is changed from a crystalline state to an amorphous state (reset). Then, when a program current is again applied to the heating layer of the PRAM device in a second cycle, the crystalline structure of the phase change material layer is maintained in an amorphous state as illustrated in FIG. 4, instead of changing from an amorphous state to a crystalline state and as a result, the phase change material layer may be maintained in a state with high resistance (reset failure).

Such a reset failure can be prevented by forming the heating layer of the PRAM device as a dual layer. That is, referring to the PRAM devices 100 and 200 of FIGS. 2A and 2B according to the current embodiments of the present invention, materials of the first heating layers 121 and 221 and the second heating layers 122 and 222 differ from each other so as to prevent reset failures. In this regard, the second heating layers 122 and 222 may be formed of high resistivity poly Si or poly-SiGe and the first heating layers 121 and 221 may be formed of a material with relatively lower resistivity, for example, TiN. TiN may be high resistivity TiN having a resistivity greater than 100 $\mu\Omega$·cm or low resistivity TiN having a resistivity of 100 $\mu\Omega$·cm or less.

Figure 5:
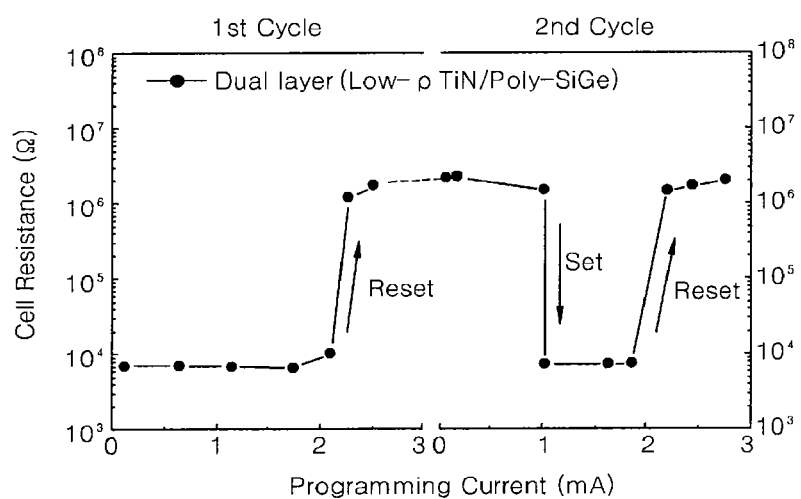
FIG. 5 is a graph for describing an operation performed with respect to a heating layer including poly-SiGe, wherein the operation does not result in a reset failure since the heating layer is formed of a dual layer.

FIG. 5 is a graph for describing an operation performed with respect to a heating layer including poly-SiGe, wherein the operation does not result in a reset failure since the heating layer is formed of a dual layer.

In FIG. 5, the result of an experiment performed when the first heating layers 121 and 221 are formed of low resistivity TiN and the second heating layers 122 and 222 are formed of poly-SiGe is illustrated. Referring to FIG. 5, the heating layers 120 and 220 are formed of a dual layer in the PRAM devices 100 and 200 according to the current embodiments of the present invention and as a result, the phase change material layers 140 and 240 are reset in the first cycle and are normally set in the second cycle and if program current is continuously increased, the phase change material layers 140 and 240 are again reset.

According to the result of FIG. 5, the reset current of a PRAM device according to the present invention is twice that of a PRAM device using only poly-SiGe (refer to FIG. 4), however, is ⅕ the reset current of a PRAM device using high resistivity TiN (refer to FIG. 3).

A principle that reset failures are prevented by forming the PRAM device as illustrated in FIGS. 2A and 2B is not clearly defined. However, it is presumed that a material such as TiN partly delays transfer of excessive heat generated from a layer with high resistivity such as a poly Si layer or a poly-SiGe layer.

Example 2

A single TiN layer is widely used for a conventional heating layer. In particular, high resistivity TiN is used. As illustrated in FIG. 3, when a heating layer is formed of low resistivity TiN, a phase change material layer is not reset and thus low resistivity TiN is not suitable as a material for forming a single heating layer.

Accordingly, in order to increase resistivity, a TiN heating layer is deposited at a relatively low temperature or is controlled to have higher composition in nitrogen concentration than that a stoichiometric composition by injecting nitrogen into a TiN thin film. However, such a TiN heating layer with high resistivity of 100 $\mu\Omega$·cm or greater is not thermodynamically stable so that when the TiN heating layer contacts other materials, the TiN heating layer easily reacts.

Figure 6A:
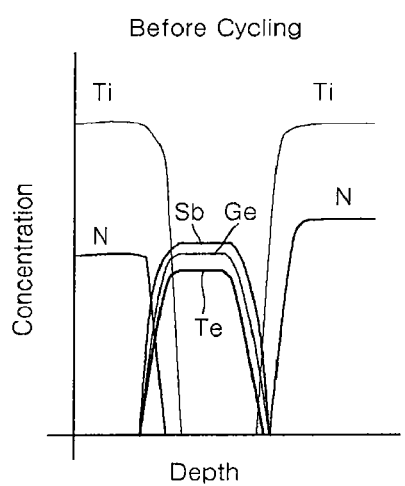
FIGS. 6A and 6B are concentration profile graphs showing diffusion of titanium according to repeated operation of a device when high resistivity TiN is used to form a heating layer.
Figure 6B:
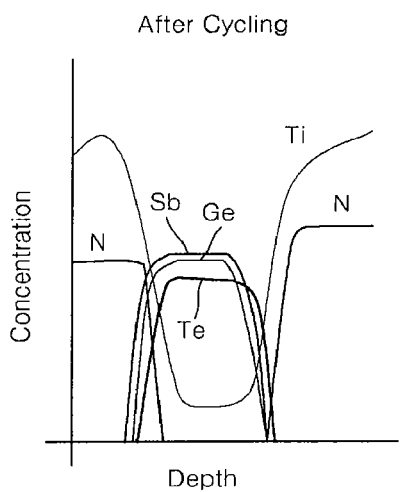

FIGS. 6A and 6B are concentration profile graphs showing diffusion of titanium according to repeated operation of a device when high resistivity TiN is used as a material for forming a heating layer. In FIGS. 6A and 6B, concentration of each element is illustrated according to depths. In particular, FIG. 6A illustrates concentration profiles of elements immediately after the manufacture of a PRAM device and FIG. 6B illustrates concentration profiles of elements after repetitive cycles of an operation of the PRAM device. Referring to FIGS. 6A and 6B, since an operation of the PRAM device is repeatedly performed, a significant amount of titanium is diffused into a GeSbTe (GST) layer. In general, it is well known that titanium and tellurium are combined to form a composition. Therefore, since such diffusion of titanium occurs continuously, composition of the GST layer is changed so that phase-change may not occur any more.

Accordingly, since the second heating layers 122 and 222 are conventional heating layers formed of high resistivity TiN and the first heating layers 121 and 221 are formed of materials which can block diffusion of titanium, reliability of the PRAM devices 100 and 200 can be significantly improved.

Materials which can block diffusion of titanium may include TaN, TiAlN, WN, WBN, TiSiN, TaSiN, WSiN, TiSiC, TaSiC, WSiC, and TiN, for example, low resistivity TiN, but are not limited thereto. In particular, low resistivity TiN may have resistivity of 100 $\mu\Omega$·cm or less, for example, 20-100 100 $\mu\Omega$·cm.

Example 3

Table 1 below shows electrical resistivity, thermal conductivity, and specific heat of a number of materials which can be used as the heating layer of the present invention, compared with a phase change material, $Ge_2Sb_2Te_5$.

TABLE 1

| | Electric Resistivity ($\mu\Omega \cdot cm$) | Thermal Conductivity ($W/m \cdot K$) | Specific Heat ($J/cm^3 \cdot K$) |
|---|---|---|---|
| $Ge_2Sb_2Te_5$ (crystalline) | 400 | 0.28 | 1.2 |
| TiN | 100 | 15 | 3.25 |
| TiAlN | 400 | 30 | 0.7 |
| TaN | 200 | 8.8 | 2.9 |
| poly Si | >1000 | 31 | 1.63 |
| poly-SiGe | >1000 | 4.7 | 1.85 |

As described above, the heating layer may have high electrical resistivity ($\rho$), low thermal conductivity, and a low specific heat. However, materials that satisfy such conditions hardly exist.

Meanwhile, as in the PRAM device of the present invention, when the heating layer is separated into two layers including a first heating layer and a second heating layer, physical properties that are more desirable and preferable exist in each of the first and second heating layers.

More specifically, the first heating layers 121 and 221 contacts the phase change material layers 140 and 240 and transfers heat, so that materials with high resistivity and small specific heat may be preferable. Resistivity should be high so as to generate a large amount of heat and specific heat should be small to maximize a temperature increase. Also, the second heating layers 122 and 222 may be formed of a material with low thermal conductivity so as not to lose heat generated from the first heating layers 121 and 221 to the lower electrodes 110 and 210 or a metal wiring disposed below the second heating layers 122 and 222.

Accordingly, TiAlN can be used as a material for forming the first heating layer and TaN, TiN, or poly-SiGe can be used as a material for forming the second heating layer. That is, TiAlN has resistivity of 400 $\mu\Omega \cdot cm$ and specific heat of 0.7 $J/cm^3 \cdot K$ and is more preferable for the material of the first heating layer than any other material illustrated in Table 1. Also, TaN has thermal conductivity of 8.8 $W/m \cdot K$ and is more preferable for the material of the second heating layer than any other materials (except poly SiGe) illustrated in Table 1.

Poly Si and poly-SiGe have higher resistivity than other materials listed in Table 1. However, when poly Si and poly-SiGe are used as materials for forming the first heating layer, a reset failure may occur as illustrated in Example 1 with reference to FIG. 4 so that poly Si and poly-SiGe may not be used as the first heating layer.

Hereinafter, a method of manufacturing a PRAM device according to an embodiment of the present invention is described.

Figure 7A:
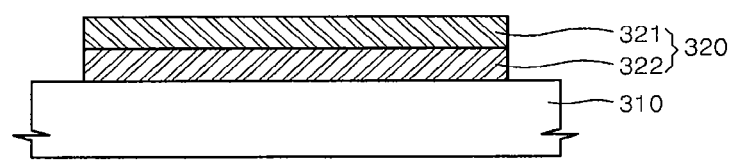
FIGS. 7A through 7C are side cross-sectional views sequentially illustrating a method of manufacturing a PRAM device, according to an embodiment of the present invention.
Figure 7B:
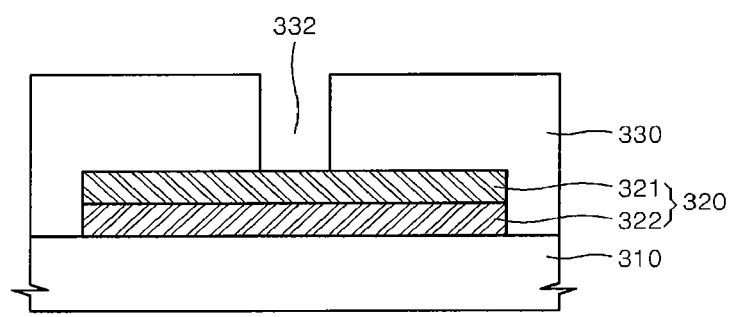
Figure 7C:
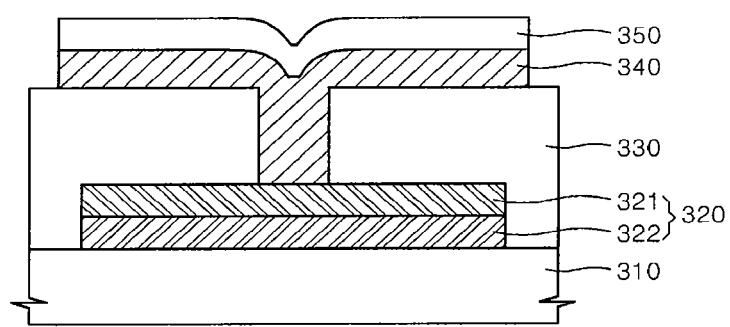

FIGS. 7A through 7C are side cross-sectional views sequentially illustrating a method of manufacturing a PRAM device, according to an embodiment of the present invention.

Referring to FIG. 7A, a heating layer 320 including a first heating layer 321 and a second heating layer 322 may be formed on a lower electrode 310 by forming a first heating material layer (not shown) and a second heating material layer (not shown) formed thereon and etching the first heating material layer and the second heating material layer to form the first heating layer 321 and the second heating layer 322, respectively. A method of forming the first heating material layer and the second heating material layer is not particularly restricted and can be any method for forming a thin film. The lower electrode 310 may be, for example, formed as a metal wiring.

Then, the first heating material layer and the second heating material layer are appropriately etched to complete manufacture of the heating layer 320 including the first heating layer 321 and the second heating layer 322. The etching method can comprise at least one of wet etching and dry etching that are well known in the art.

The first heating layer 321 and the second heating layer 322 can be formed using a combination of materials described above.

Alternatively, resistivity of materials forming the first heating layer 321 can be lower than that of materials forming the second heating layer 322. For example, the first heating layer 321 can be formed of TiN and the second heating layer 322 can be formed of poly Si and poly-SiGe. In particular, the TiN may be high resistivity TiN having a resistivity greater than 100 $\mu\Omega \cdot cm$ or low resistivity TiN having a resistivity of 100 $\mu\Omega \cdot cm$ or less.

Alternatively, the first heating layer 321 can be selectively formed of a material which can block diffusion of titanium. Alternatively, the second heating layer 322 can comprise a conventional heating layer including TiN. Materials which can block diffusion of titanium may include TaN, TiAlN, WN, WBN, TiSiN, TaSiN, WSiN, TiSiC, TaSiC, WSiC, and TiN, for example, low resistivity TiN. However, the present invention is not limited thereto.

Alternatively, resistivity of the material forming the first heating layer 321 may be higher than that of the material forming the second heating layer 322 and thermal conductivity of the material forming the second heating layer 322 may be lower than that of the material forming the first heating layer 321. For example, TiAlN can be used as a material for forming the first heating layer 321 and TaN, TiN, or poly-SiGe can be used as a material for forming the second heating layer 322.

Referring to FIG. 7B, an insulation layer 330 is formed to cover upper surfaces of the heating layer 320 and the lower electrode 310 and then a contact hole 332 is formed in the insulation layer 330 so that a portion of the heating layer 320 is exposed. Referring to FIG. 7C, a phase change material layer 340 is formed to fill the contact hole 332. The phase change material layer 340 can be formed of any conventional phase change material. A method of forming the phase change material layer 340 to fill the contact hole 332 can be any method that is well known in the art and may be a sputtering method, a chemical vapor deposition (CVD) method having an excellent step coverage characteristic, or an atomic layer deposition (ALD) method.

The phase change material layer 340 can also be formed to cover an upper portion of the insulation layer 330.

Then, an upper electrode 350 is formed on the phase change material layer 340. A method of forming the upper electrode 350 can be any method that is well known in the art and is not particularly restricted. The upper electrode 350 and the phase change material layer 340 can be selectively etched so that some portions of the upper electrode 350 and the phase change material layer 340 are remained on the insulation layer 330.

Figure 8A:
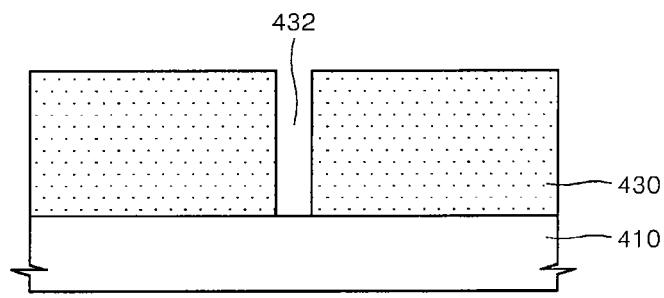
FIGS. 8A through 8C are side cross-sectional views sequentially illustrating a method of manufacturing a PRAM device, according to another embodiment of the present invention.
Figure 8B:
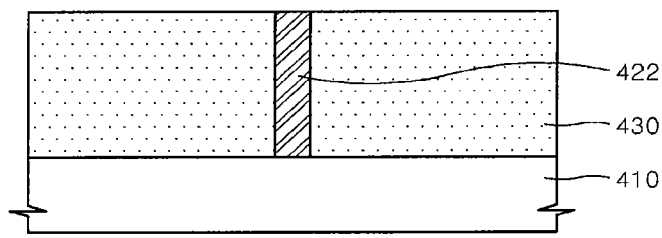
Figure 8C:
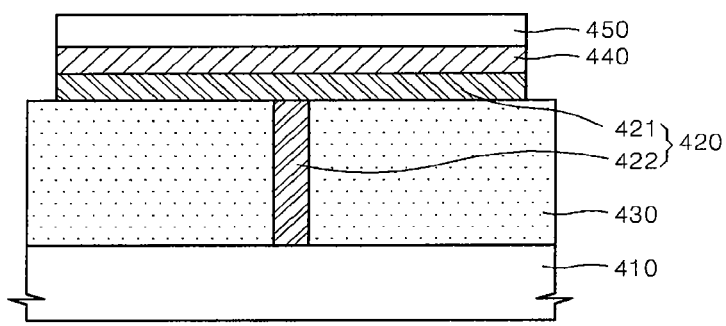

FIGS. 8A through 8C are side cross-sectional views sequentially illustrating a method of manufacturing a PRAM device, according to another embodiment of the present invention. The PRAM device manufactured using the method illustrated in FIGS. 8A through 8C is different from the PRAM device manufactured using the method illustrated in FIGS. 7A through 7C. In particular, the difference is that a heating layer with a small cross-section that is surrounded by an insulation layer is disposed beneath the lower part of a phase-change material layer in FIGS. 8A through 8C.

Referring to FIG. 8A, an insulation layer 430 is formed on a lower electrode 410 and then a contact hole 432 is formed in the insulation layer 430 so that a portion of the lower electrode 410 is exposed. The lower electrode 410 may be formed on a substrate (not shown). Then, referring to FIG. 8B, a second heating layer 422 is formed in the contact hole 432. A method of forming the second heating layer 422 includes depositing a material for forming the second heating layer 422 in the contact hole 432 and performing a chemical mechanical polishing (CMP) method so that the upper surface of the second heating layer 422 and the upper surface of the insulation layer 430 can be located on the same plane.

Referring to FIG. 8C, a first heating layer 421 is formed on the second heating layer 422 and a phase-change material layer 440 and an upper electrode 450 are sequentially formed on the first heating layer 421. Alternatively, the first heating layer 421, the phase-change material layer 440, and the upper electrode 450 can be etched to be self-aligned.

Figure 8D:
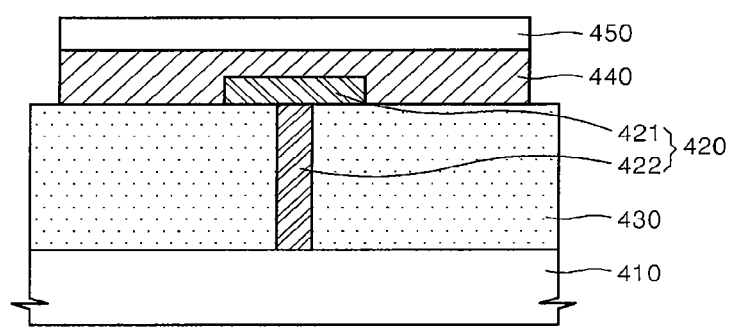
FIG. 8D is a side cross-sectional view illustrating a selective method of manufacturing a PRAM device, according to another embodiment of the present invention.

Alternatively, a method of forming the first heating layer 421 may be selectively performed as illustrated in FIG. 8D. Referring to FIG. 8D, the first heating layer 421 is formed on the second heating layer 422 and then the first heating layer 421 is etched to have a small cross-section. Then, the phase-change material layer 440 and the upper electrode 450 are formed and may be etched to be self-aligned as described above.

In the embodiments illustrated in FIGS. 8A through 8D, the combination of the materials used to form the first heating layer 421 and the second heating layer 422 can be same as that of the embodiment illustrated in FIGS. 7A through 7C.

A PRAM device according to the present invention can be used in, for example, mobile communication means such as computers and mobile phones, PDAs, electronic dictionaries, MP3 players, and other electronic devices.

As described above, since the PRAM device according to the present invention includes a heating layer having optimal heating characteristics, a PRAM device having high reliability and excellent operating characteristics can be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A Phase-change Random Access Memory (PRAM) device comprising:
   a lower electrode formed on a semiconductor substrate;
   an upper electrode formed on the lower electrode;
   a phase change material layer disposed between the lower electrode and the upper electrode, and
   a heating layer disposed between the upper electrode or the lower electrode and the phase change material layer,
   wherein the heating layer comprises a first heating layer configured to have a first resistivity and a second heating layer configured to have a second resistivity, the first heating layer contacting the phase change material layer and the second heating layer contacting the first heating layer and being disposed between the first heating layer and the lower electrode,
   wherein the first resistivity is lower than the second resistivity, and
   wherein the first heating layer is configured to at least partly delay transfer of heat generated from the second heating layer such that a reset failure of the PRAM device is prevented.

2. The device of claim 1, wherein the second heating layer comprises polysilicon germanium (poly-SiGe).

3. The device of claim 1, wherein the first heating layer comprises a material which blocks diffusion of titanium.

4. The device of claim 3, wherein the first heating layer comprises at least one selected from the group consisting of TaN, TiAlN, WN, WBN, TiSiN, TaSiN, WSiN, TiSiC, TaSiC, WSiC, and low resistivity TiN.

5. The device of claim 4, wherein the low resistivity TiN has a resistivity of $100\mu\Omega\cdot cm$ or less.

6. The device of claim 4, wherein the second heating layer comprises high resistivity TiN.

7. The device of claim 6, wherein the high resistivity TiN has a resistivity greater than $100\mu\Omega\cdot cm$.

* * * * *